(12) United States Patent
Woo et al.

(10) Patent No.: US 12,061,213 B2
(45) Date of Patent: *Aug. 13, 2024

(54) NON-CONTACT VOLTAGE MEASUREMENT WITH ADJUSTABLE SIZE ROGOWSKI COIL

(71) Applicant: Fluke Corporation, Everett, WA (US)

(72) Inventors: Ginger M. Woo, Shoreline, WA (US);
Gloria M. Chun, Seattle, WA (US);
Ricardo Rodriguez, Mill Creek, WA (US); Ronald Steuer, Hinterbruhl (AT)

(73) Assignee: Fluke Corporation, Everett, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/303,397

(22) Filed: Apr. 19, 2023

(65) Prior Publication Data
US 2023/0251289 A1 Aug. 10, 2023

Related U.S. Application Data

(63) Continuation of application No. 17/169,123, filed on Feb. 5, 2021, now Pat. No. 11,662,368.
(Continued)

(51) Int. Cl.
*G01R 15/18* (2006.01)
*H04Q 9/00* (2006.01)

(52) U.S. Cl.
CPC ............. *G01R 15/181* (2013.01); *H04Q 9/00* (2013.01); *H04Q 2209/40* (2013.01)

(58) Field of Classification Search
CPC .. G01R 15/181; G01R 1/06788; G01R 15/12; G01R 15/142; H04Q 9/00
See application file for complete search history.

(56) References Cited

U.S. PATENT DOCUMENTS 3,652,935 A 3/1972 Shaw
4,799,005 A 1/1989 Fernandes
(Continued)

FOREIGN PATENT DOCUMENTS

CN 205003199 U 1/2016
CN 107192868 A 9/2017
(Continued)

OTHER PUBLICATIONS

Extended European Search Report for Application No. EP 21 15 5533.9, dated Jun. 17, 21, 8 pgs.
(Continued)

*Primary Examiner* — Christopher E Mahoney
(74) *Attorney, Agent, or Firm* — Seed IP Law Group LLP (57) ABSTRACT

A sensor probe includes a body having first and second channels that are spaced apart and extend through the body approximately parallel to each other. A first end of a Rogowski coil is fixed within the first channel. The Rogowski coil passes through the second channel and loops back to the first channel where a second end of the Rogowski coil is selectively insertable into the first channel opposite the first end of the Rogowski coil. A non-contact sensor coupled to the body is positioned between the first and second channels to measure a parameter of an insulated conductor situated within the loop formed by the Rogowski coil. The size of an interior region within the loop is selectively adjustable by sliding movement of the Rogowski coil within the second channel.

20 Claims, 8 Drawing Sheets

Related U.S. Application Data (60) Provisional application No. 62/970,692, filed on Feb. 5, 2020.

(56) References Cited

U.S. PATENT DOCUMENTS

| | | |
|---|---|---|
| 5,473,244 A | 12/1995 | Libove et al. |
| 6,456,060 B1 | 9/2002 | Wiesemann |
| 6,975,104 B2 | 12/2005 | Gregorec, Jr. |
| 7,259,546 B1 | 8/2007 | Hastings et al. |
| 8,120,350 B2 | 2/2012 | Shah et al. |
| 8,330,449 B2 | 12/2012 | Greenberg |
| 9,791,479 B2 | 10/2017 | Tierney et al. |
| 10,119,998 B2 | 11/2018 | Ringsrud et al. |
| 10,139,435 B2 | 11/2018 | Steuer et al. |
| 10,281,503 B2 | 5/2019 | Steuer et al. |
| 10,295,574 B2 | 5/2019 | Nanshan |
| 10,352,967 B2 | 7/2019 | Steuer et al. |
| 10,591,515 B2 | 3/2020 | Rodriguez et al. |
| 10,746,767 B2 | 8/2020 | Worones et al. |
| 11,662,368 B2 * | 5/2023 | Woo .............. G01R 15/142 324/126 |
| 2006/0082356 A1 | 4/2006 | Zhang et al. |
| 2013/0257412 A1 | 10/2013 | Wynne |
| 2015/0002138 A1 | 1/2015 | Fox |
| 2016/0077133 A1 | 3/2016 | Lee et al. |
| 2018/0136257 A1 | 5/2018 | Steuer et al. |
| 2019/0346492 A1 | 11/2019 | Worones et al. |

FOREIGN PATENT DOCUMENTS

| | | |
|---|---|---|
| CN | 208173327 U | 11/2018 |
| KR | 20100094018 A | 8/2010 |

OTHER PUBLICATIONS

Extended European Search Report for Application No. EP 21 15 5537.0, dated Jun. 28, 21, 9 pgs.

\* cited by examiner

NON-CONTACT VOLTAGE MEASUREMENT WITH ADJUSTABLE SIZE ROGOWSKI COIL

BACKGROUND

Technical Field

The present disclosure generally relates to electrical parameter measurement devices, and more particularly, to sensor probes for electrical parameter measurement devices.

Description of the Related Art

Voltmeters are instruments used for measuring voltage in an electric circuit. Instruments which measure more than one electrical characteristic are referred to as multimeters, and operate to measure a number of parameters generally needed for troubleshooting, service, and maintenance applications. Such parameters typically include alternating current (AC) voltage and current, direct current (DC) voltage and current, and resistance or continuity. Other parameters, such as power characteristics, frequency, capacitance, and temperature, may also be measured to meet the requirements of a particular application.

With conventional voltmeters or multimeters that measure AC voltage, it is necessary to bring at least two measurement electrodes or probes into galvanic contact with a conductor, which often requires cutting away part of the insulation of an insulated electrical wire, or providing a terminal for measurement in advance. Besides requiring an exposed wire or terminal for galvanic contact, the step of touching voltmeter probes to stripped wires or terminals can be relatively dangerous due to the risks of shock or electrocution. A "non-contact" voltage measurement device may be used to detect the presence of alternating current (AC) voltage without requiring galvanic contact with the circuit. When a voltage is detected, the user is alerted by an indication, such as a light, buzzer, or vibrating motor. However, such non-contact voltage detectors provide only an indication of the presence or absence of an AC voltage, and do not provide an indication of the actual magnitude (e.g., RMS value) of the AC voltage.

A general purpose multimeter employing an internal current shunt may be limited to ten amperes maximum, for example, because of the capacity of the multimeter test leads and circuitry to carry the current. Furthermore, the multimeter generally must be protected with an internal fuse to prevent excessive current levels from flowing through the multimeter, both for safety reasons and to prevent damage to the multimeter. The difficulty in removing a blown fuse, coupled with the time and cost necessary to procure a replacement fuse, make it desirable to obtain a non-contact current measuring instrument that requires no internal fuse.

Clamp-on multimeters provide improved capability for measuring current over general purpose multimeters by employing an integral current clamp that senses the current in the current-carrying conductor without having to cut the current-carrying conductor or break the circuit including the current-carrying conductor. A current clamp is typically provided in the same housing with a multimeter that measures other parameters such as voltage and resistance in the conventional manner using separate test probes. The current clamp is closed around the current-carrying conductor to sense the magnetic field created by the current flow. The current clamp provides a voltage signal for measurement by the multimeter which calculates and displays the measured current level. Because there is no current shunted from the current-carrying conductor through the clamp-on multimeter, the constraint on the maximum current that may be measured has largely been eliminated. Likewise, the internal fuse has been eliminated in clamp-on multimeters.

In order to obtain a valid current measurement, the magnetic core in the current clamp must encircle the current-carrying conductor so that the current clamp is closed. The current clamp must be mechanically actuated to open the jaws, the current-carrying conductor inserted, and the jaws then closed around the current-carrying conductor. In tight physical spaces such as an electrical cabinet, inserting the clamp-on multimeter and using this technique to make a current measurement may be inconvenient and difficult. Moreover, the jaws must be aligned to complete the magnetic core for obtaining a valid current measurement. Clamp-on multimeters are therefore difficult to use in confined spaces and require a large physical space in which to open the jaws of the current clamp. Clamp-on multimeters also tend to be physically heavy because of the substantial amount of iron used on the magnetic core. Furthermore, high levels of current may saturate the magnetic core. The current measuring capacity of the clamp-on multimeter is accordingly limited to current levels that do not saturate the magnetic core.

A Rogowski coil is able to sense alternating current flowing through a conductor surrounded by the Rogowski coil. There are a number of differences between the Rogowski coil and a clamp. For example, a Rogowski coil is more flexible and has a smaller cross-section than the substantially rigid clamp of the multimeter. The Rogowski coil can accordingly be used in confined spaces that are too tight and/or too small for the clamp-type multimeter. Further, the loop of a Rogowski coil can be reshaped to surround conductors having cross-sections that the clamp cannot close around. Another difference is the greater current measuring capability of the Rogowski coil as compared to the clamp. Specifically, an air core of a Rogowski does not become saturated at levels of current that saturate the magnetic material of the cores of the clamp.

U.S. Pre-Grant Publication No. 2019/0346492, assigned to the assignee of the present disclosure, discloses an adjustable length Rogowski coil measurement device with non-contact voltage measurement capabilities. Modeled after the appearance of a conventional Rogowski coil, the measurement device includes a Y-shaped body having channels that are spaced apart from each other at one end and adjacent to each other at the other end. One of the channels includes a lateral opening extending between the two ends that allows a length of the Rogowski coil to be inserted into and removed from the channel. A user can grasp the ends of the Rogowski coil and pull them downward to "cinch" the loop of the Rogowski coil around an insulated conductor situated within loop. With a curved Y-shaped set of channels however, the user may experience difficulty pulling the Rogowski coil through the channels, and with the diverging spaced-apart ends of the channels directing the Rogowski coil in somewhat opposite directions, the required bend in the loop to cinch the loop around an insulated conductor may prevent a tight fit of the loop around the conductor.

BRIEF SUMMARY

Disclosed herein is a sensor probe operative to sense an electrical parameter in an insulated conductor. In various embodiments, the sensor probe may be summarized as including a body, a Rogowski coil, and a non-contact sensor. The body has a first channel and a second channel defined therein. The first channel and the second channel each have respective first and second open ends that are spaced apart from each other. Additionally, the first and second channels extend through the body approximately parallel to each other.

The Rogowski coil has first and second ends, in which the first end of the Rogowski coil is fixed within the first channel of the body. The Rogowski coil extends out of the first end of the first channel, passes through the first and second ends of the second channel, and loops back to the second end of the first channel where the second end of the Rogowski coil is selectively insertable into the first channel opposite the first end of the Rogowski coil.

The non-contact sensor is coupled to the body and is positioned between the respective second ends of the first and second channels.

The second channel of the body is sized and dimensioned to slidably contain a length of the Rogowski coil therein such that a first loop of the Rogowski coil is formed between the respective first open ends of the first and second channels. When the second end of the Rogowski coil is inserted into the second end of the first channel, a second loop of the Rogowski coil is formed between the respective second open ends of the first and second channels.

A size of an interior region within the first loop and the second loop is selectively adjustable by sliding movement of the Rogowski coil within the second channel. When the insulated conductor is situated within the second loop formed by the Rogowski coil, the non-contact sensor is operative to sense at least one electrical parameter of the insulated conductor without requiring galvanic contact with the insulated conductor.

Embodiments of the sensor probe may include the following features or aspects: wherein the second end of the first channel of the body includes a fastener that is operative to releasably secure the second end of the Rogowski coil within the first channel when the second end of the Rogowski coil is selectively inserted into the first channel; wherein when the second end of the Rogowski coil is selectively inserted into the second end of the first channel, sidewalls of the first channel abut the Rogowski coil and releasably secure the second end of the Rogowski coil within the first channel by an interference fit; wherein the Rogowski coil is not removable from the second channel during normal use of the sensor probe; a second non-contact sensor coupled to the Rogowski coil, wherein the second non-contact sensor is operative to sense an electrical parameter in the insulated conductor when the insulated conductor is within the second loop formed by the Rogowski coil; an interface connector operatively coupled to the non-contact sensor and the Rogowski coil, wherein the interface connector is detachably couplable to a corresponding interface connector of a main body of a measuring device; wherein the non-contact sensor comprises at least one of a non-contact voltage sensor, a non-contact current sensor, a Hall Effect sensor, a fluxgate sensor, an anisotropic magnetoresistance (AMR) sensor, or a giant magnetoresistance (GMR) sensor; a locking mechanism operative in an open position to allow the Rogowski coil to freely slide within the second channel, and in a closed position to releasably secure the Rogowski coil and prevent sliding movement of the Rogowski coil within the second channel; and wherein the body includes an interior cavity that is sized to encompass the first loop of the Rogowski coil.

Also disclosed herein is a device for measuring an electrical parameter in an insulated conductor. In various embodiments, the device may be summarized as including a sensor probe as described above, and control circuitry communicatively couplable to the non-contact sensor and the Rogowski coil. In operation, the control circuitry is configured to receive sensor data indicative of signals detected by at least one of the non-contact sensor or the Rogowski coil, and process the received sensor data to determine at least one electrical parameter of the insulated conductor.

In various embodiments, embodiments of the device may include the following features or aspects: a measuring instrument with a main body that contains the control circuitry; wherein the main body includes at least one interface connector, and the sensor probe is detachably connectable to the at least one interface connector of the main body; wherein the main body further includes the body of the sensor probe; wherein the control circuitry, in operation, is configured to process the received sensor data to determine a voltage in the insulated conductor; wherein the control circuitry, in operation, is further configured to process the received sensor data to determine a current in the insulated conductor; a wireless communications subsystem operatively coupled to the control circuitry, wherein in operation the wireless communication subsystem is configured to wirelessly transmit the determined electrical parameter to an external system; a display that, in operation, is configured to visually present the determined electrical parameter to a user of the device; and wherein the non-contact sensor comprises at least one of a non-contact voltage sensor, a non-contact current sensor, a Hall Effect sensor, a fluxgate sensor, an anisotropic magnetoresistance (AMR) sensor, or a giant magnetoresistance (GMR) sensor.

In further embodiments, a sensor probe operative to detect an electrical parameter in an insulated conductor may comprise a Rogowski coil having a first end and a second end; a body fixedly coupled to the first end of the Rogowski coil, the body comprising a channel that is sized and dimensioned to allow a length of the Rogowski coil to slidably pass through the channel and selectively adjust the size of a loop formed by the Rogowski coil when the second end of the Rogowski coil is inserted into the body, wherein the size of the loop is adjusted by way of sliding movement of the Rogowski coil relative to the body through the channel; and a non-contact sensor coupled to the body, wherein the non-contact sensor is operative to sense at least one electrical parameter in the insulated conductor without requiring galvanic contact with the insulated conductor when the insulated conductor is within the loop of the Rogowski coil.

The sensor probe may further comprise a locking mechanism positioned within the channel, wherein the locking mechanism is operative in an open position to allow the Rogowski coil to freely slide within the channel, and in a closed position to releasably secure the Rogowski coil and prevent sliding movement of the Rogowski coil within the channel.

In the drawings, identical reference numbers identify similar elements. The sizes and relative positions of elements in the drawings are not necessarily drawn to scale. For example, the shapes of various elements and angles and spaces between elements are not necessarily drawn to scale, and some of these elements may be arbitrarily enlarged and positioned to improve drawing legibility. Further, the particular shapes of the elements as drawn are not necessarily intended to convey information regarding any required shape of the elements, and may have been selected solely for ease of recognition in the drawings.

DETAILED DESCRIPTION

One or more embodiments of the present disclosure are directed to an electrical parameter sensor probe and to devices and methods for measuring electrical parameters (e.g., voltage, current) in an insulated electrical conductor (e.g., insulated wire) without requiring a galvanic connection with the conductor. As described herein, an electrical parameter measurement device is configured to measure one or more electrical parameters in an insulated conductor. Such devices that do not require a galvanic connection with the conductor to measure the parameter(s) are non-contact devices. As used herein, a "non-contact" device or sensor is operative to detect an electrical parameter in an insulated conductor without requiring galvanic contact with the conductor.

In various embodiments, a non-contact, electrical parameter sensor probe is provided that is operative to accurately measure both current and voltage in an insulated conductor under test. The sensor probe includes a body, a Rogowski coil coupled to the body, and a non-contact sensor coupled to at least one of the body or the Rogowski coil. The size of a loop of the Rogowski coil is selectively adjustable, such that the loop may be tightened around an insulated conductor under test until the conductor is positioned adjacent to a portion of the body or Rogowski coil that includes the non-contact sensor. Thus, once the loop of the Rogowski coil is tightened, the loop helps maintain the position of the insulated conductor adjacent to the non-contact sensor to obtain accurate measurements (e.g., voltage measurements) while the Rogowski coil obtains accurate current measurements. One or more electrical parameters, such as power or phase angle, may be derived using the obtained voltage and current measurements. The measured electrical parameters may be provided to a user, e.g., via a display, or may be transmitted to one or more external systems via a suitable wired or wireless connection.

In the following description, certain specific details are set forth in order to provide a thorough understanding of various disclosed implementations. However, a person skilled in the art will recognize that additional implementations may be practiced without one or more of these specific details, or with other methods, components, materials, etc.

Additionally, reference throughout this specification to "one embodiment" or "an embodiment" means that a particular feature, structure or characteristic described in connection with the embodiment is included in at least one embodiment. Furthermore, appearance of the phrase "in at least one embodiment" in this specification does not necessarily refer to only one embodiment. The particular features, structures, or characteristics of the various embodiments described herein may be combined in any suitable manner in yet additional embodiments.

Figure 1:
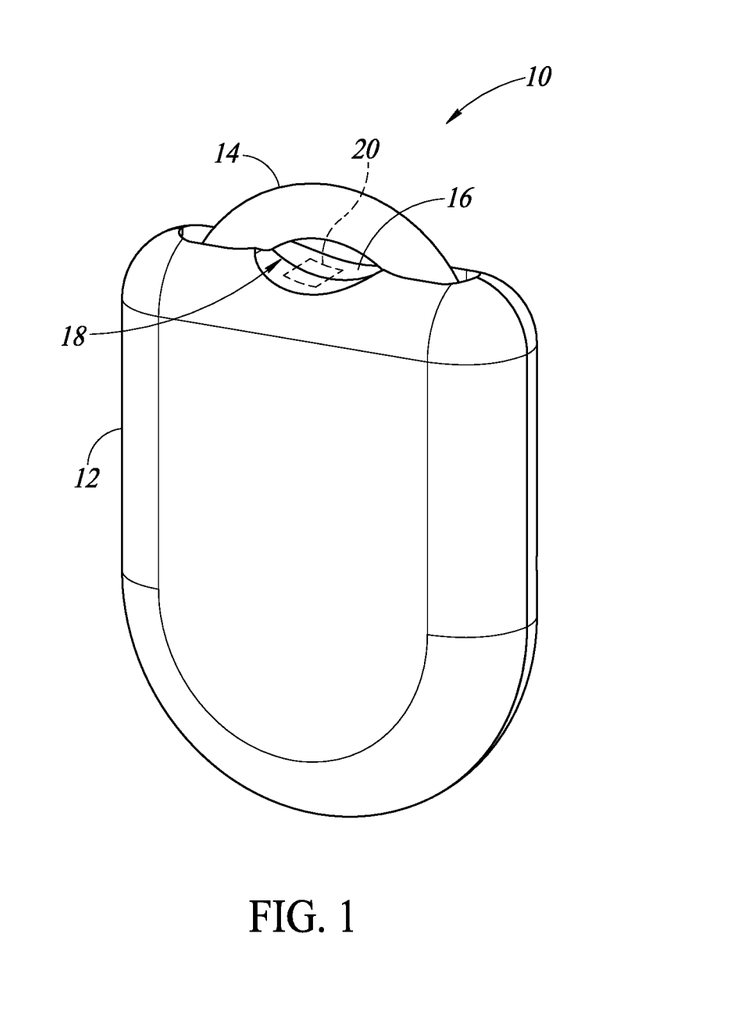
FIG. 1 is a front, right perspective view of at least one non-limiting embodiment of an electrical parameter sensor probe that includes a body, a Rogowski coil, and a non-contact sensor.
Figure 2:
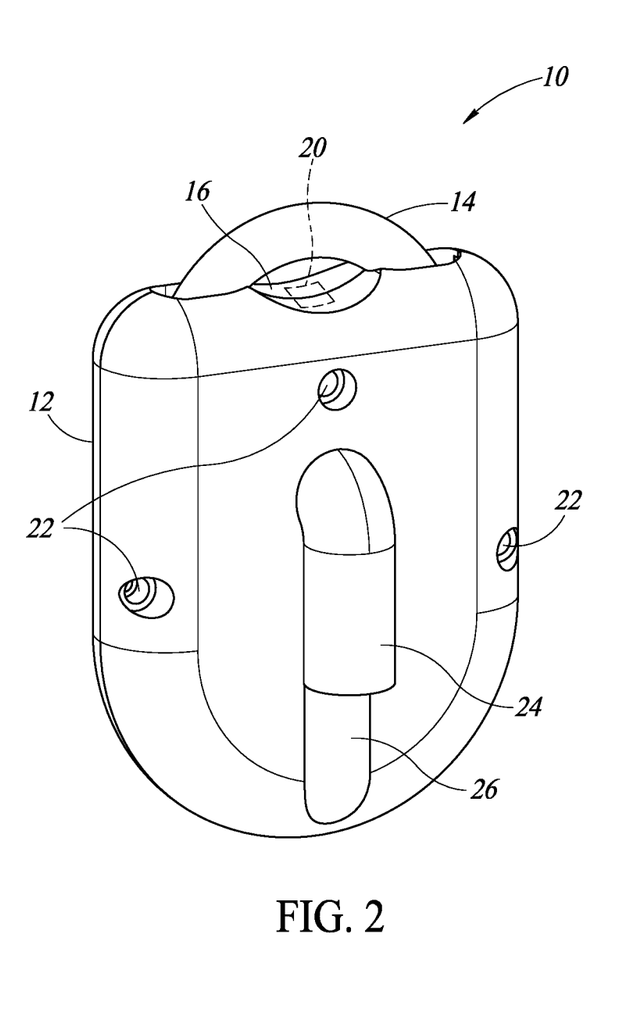
FIG. 2 is a rear, right perspective view of the sensor probe of FIG. 1.
Figure 8:
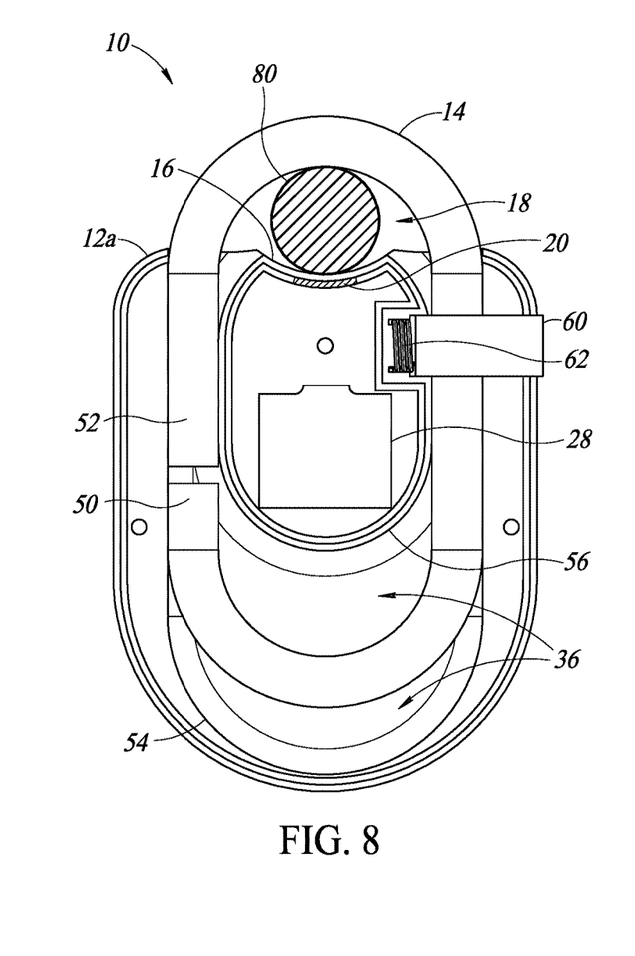
FIG. 8 is a rear elevation view of the sensor probe as shown in FIG. 6, in which an insulated conductor is positioned within the interior region of the Rogowski coil, and the Rogowski coil has been partially retracted within the body of the sensor probe.

FIG. 1 is a front, right perspective view of at least one non-limiting embodiment of an electrical parameter sensor probe 10 that includes a body 12, a Rogowski coil 14, and a non-contact sensor 20. FIG. 2 is a rear, right perspective view of the sensor probe 10 of FIG. 1. Situated along a side of the body 12 proximate to the Rogowski coil 14 is a concave saddle 16 that, together with a loop of the Rogowski coil, provides an interior region 18 in which an insulated conductor may be positioned adjacent to the non-contact sensor 20, e.g., as shown in FIG. 8.

In some embodiments, the body 12 is comprised of two halves 12a, 12b that may be fixedly or removably coupled to each other. In the embodiment shown in FIG. 2, screws or other securing mechanisms are inserted through apertures 22 to secure the rear half 12b to the front half 12a of the body 12. Projecting out of the rear half 12b of the body 12 is a protective shell 24 that receives a cable (not shown) usable to connect the sensor probe 10 to external equipment, such as a measuring instrument that is capable of receiving and processing measurement signals or data communicated by the sensor probe 10. The cable may lie within a trough 26 defined in the body 12 that accommodates a close fit of the cable to the body 12.

The Rogowski coil 14 is flexible and has a length that extends between a first end 50 and a second end 52. As with conventional Rogowski coils, the Rogowski coil 14 may include a toroidal coil having a central wire surrounded by the same wire wound in a helix around a flexible, non-magnetic core and sheathed in a flexible covering. As a result, one end of the coil is taken through the coil itself and brought out the other side so that both ends of the coil are on the same side (e.g., first end 50, second end 52). The ends of the coil may be electrically connected to a cable as mentioned above such that signals from the Rogowski coil 14 are sent to an external measuring instrument for processing. The non-magnetic core may include air, for example. The covering of the Rogowski coil 14 may be sufficiently rigid to protect the form of the toroidal coil, and still be sufficiently flexible to allow the Rogowski coil to be formed into a loop that is adjustable in size and shape, as discussed further below.

The body 12 of sensor probe 10 includes a non-contact sensor 20 (e.g., a non-contact voltage sensor) coupled thereto that operates to sense an electrical parameter (e.g., voltage) in an insulated conductor under test without requiring a galvanic connection with the conductor. Additionally or alternatively, one or more non-contact sensors may be coupled to the Rogowski coil 14 in addition to or instead of the body 12 of the sensor probe. The non-contact sensor 20 may be electrically connected to a cable such that signals from the sensor 20 are sent to the measuring instrument for processing. In various embodiments, the non-contact sensor 20 may include a non-contact voltage sensor, a non-contact current sensor, a Hall Effect element, a current transformer, a fluxgate sensor, an anisotropic magnetoresistance (AMR) sensor, a giant magnetoresistance (GMR) sensor, or other types of sensors operative to sense an electrical parameter of the insulated conductor (e.g., conductor 80 shown in FIG. 8) without requiring galvanic contact. Various non-limiting examples of non-contact sensors are disclosed in U.S. Provisional Patent Application No. 62/421,124, filed Nov. 11, 2016; U.S. patent application Ser. No. 15/345,256, filed Nov. 7, 2016; U.S. patent application Ser. No. 15/413,025, filed Jan. 23, 2017; U.S. patent application Ser. No. 15/412,891, filed Jan. 23, 2017; U.S. patent application Ser. No. 15/604,320, filed May 24, 2017, and U.S. patent application Ser. No. 15/625,745, filed Jun. 16, 2017, the contents of which are incorporated herein by reference, in their entirety.

The sensor probe 10 may also include processing or control circuitry 28 operatively coupled to the non-contact sensor 20 and/or the Rogowski coil 14. The processing or control circuitry 28 is operative to process sensor signals received from the sensor 20 and/or the Rogowski coil 14, and to send sensor data indicative of such sensor signals to control circuitry in the external measuring instrument. The control circuitry 28 may additionally or alternatively include conditioning or conversion circuitry that is operative to condition or convert the signals into a form receivable by a measuring instrument, such as an analog form (e.g., 0-1 V) or a digital form (e.g., 8 bits, 16 bits, 64 bits).

Figure 16:
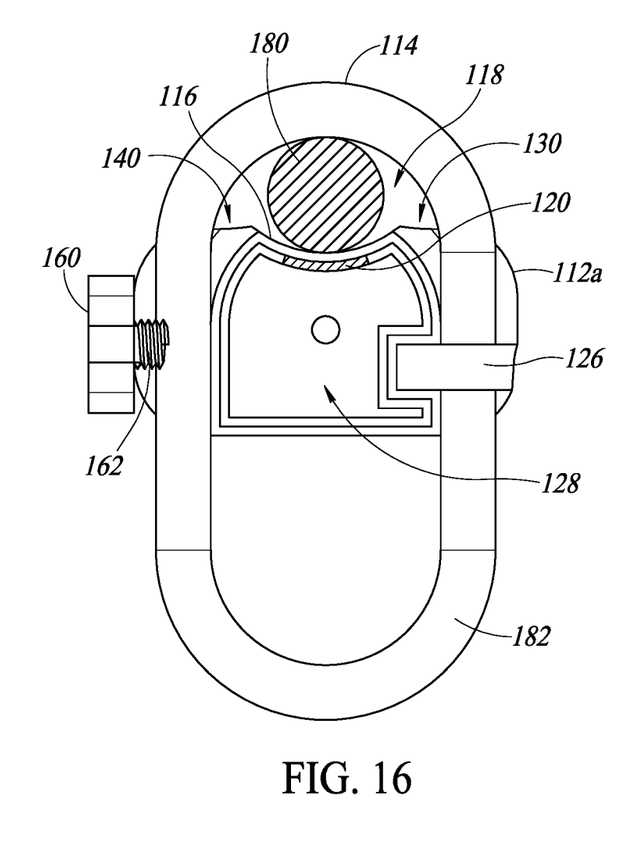
FIG. 16 is a front elevation view of the sensor probe as shown in FIG. 15, in which the Rogowski coil has been retracted toward the insulated conductor.

To obtain a measurement using a non-contact voltage sensor, for example, it may be advantageous for the sensor 20 to be as close as possible to the conductor 80 under test (see FIG. 8). In at least some implementations, it may also be advantageous for the conductor 80 to be positioned at a particular orientation (e.g., perpendicular) relative to the non-contact sensor 20. With conventional Rogowski coils that have relatively large, non-adjustable loops (e.g., 10 inches, 18 inches), the Rogowski coil hangs off of a conductor under test at a point that is spaced from the body of the sensor probe. From this position, it may be difficult or impossible for a non-contact voltage sensor to obtain accurate voltage measurements of the conductor under test. As discussed further below, in one or more embodiments of the present disclosure, a loop of the Rogowski coil 14 is selectively adjustable such that, as shown in FIGS. 8 and 16, the loop may be tightened around the conductor 80, 180 to position the conductor adjacent the non-contact sensor 20, 120 so that an accurate measurement may be obtained.

Figure 3:
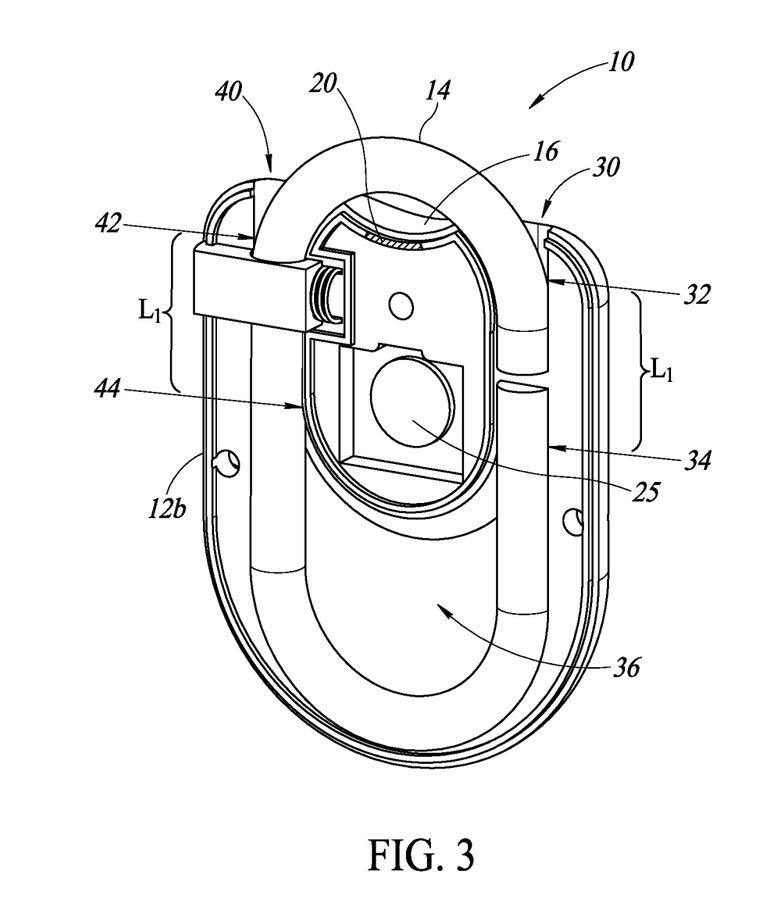
FIG. 3 is a front, right perspective view of the sensor probe of FIG. 1, in which a front half of the body of the sensor probe has been removed.
Figure 4:
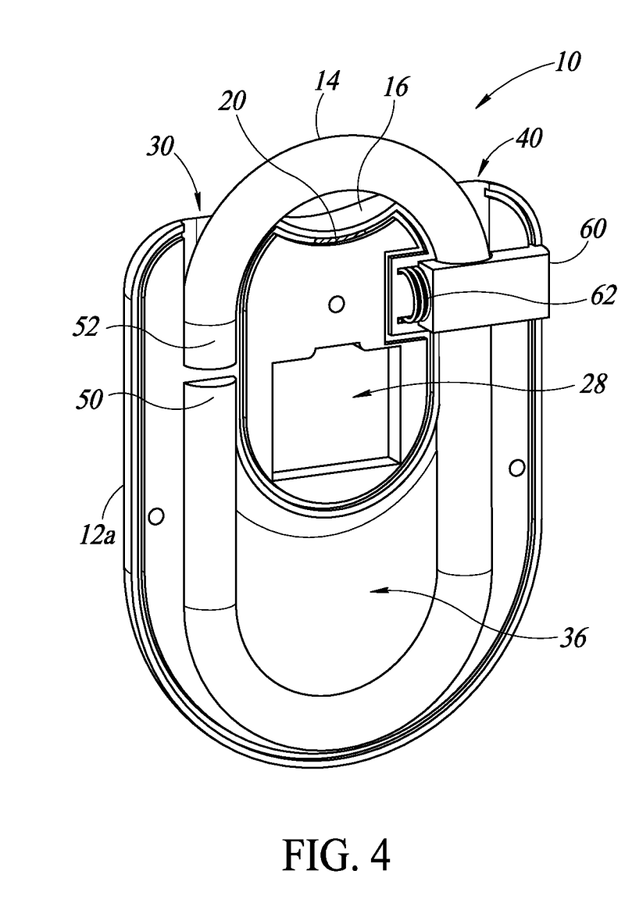
FIG. 4 is a rear, right perspective view of the sensor probe of FIG. 1, in which a rear half of the body of the sensor probe has been removed.
Figure 5:
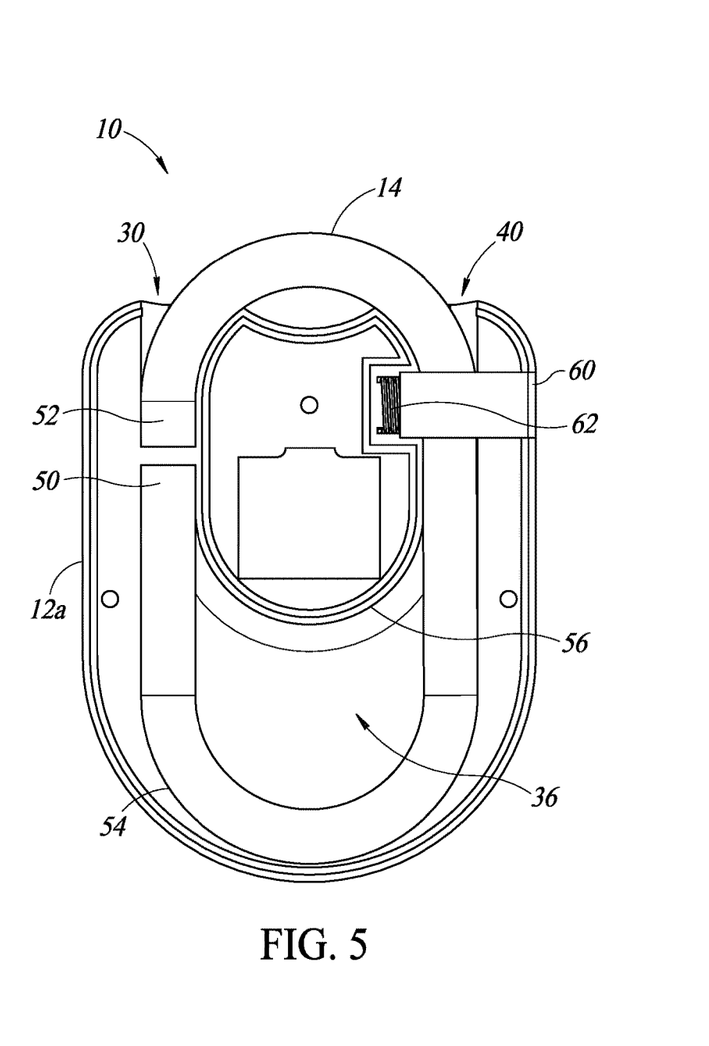
FIG. 5 is a rear elevation view of the sensor probe as shown in FIG. 3, in which the Rogowski coil is retracted within the body of the sensor probe.

FIGS. 3-8 depict an arrangement of components that are interior to the body 12 of the sensor probe 10. FIG. 3 is a front, right perspective view of the sensor probe 10 in which a front half 12a of the body 12 of the sensor probe has been removed, while in FIG. 4, a rear half 12b of the body 12 has been removed. FIG. 5 provides a rear elevation view of the sensor probe 10 as shown in FIG. 3, in which the Rogowski coil 14 is retracted within the body 12 of the sensor probe 10.

The body 12 of the sensor probe 10 includes a first channel 30 and a second channel 40. The first channel 30 and the second channel 40 each have respective first and second open ends 34, 32 and 44, 42 that are spaced apart from each other. The first and second channels 30, 40 extend through the body 12 approximately parallel to each other.

The Rogowski coil 14 has first and second ends 50, 52. The first end 50 of the Rogowski coil 14 is fixed within the first channel 30 of the body 12. The Rogowski coil 14 extends out of the first end 34 of the first channel 30, passes through the first and second ends 44, 42 of the second channel 40, and loops back to the second end 32 of the first channel 30 where the second end 52 of the Rogowski coil 14 is selectively insertable into the first channel 30 opposite the first end 50 of the Rogowski coil 14. The non-contact sensor 20 is coupled to the body 12 and positioned between the respective second ends 32, 42 of the first and second channels 30, 40.

The second channel 40 of the body 12 is sized and dimensioned to contain a length $L_1$ of the Rogowski coil 14 therein such that a first loop of the Rogowski coil is formed between the respective first open ends 34, 44 of the first and second channels 30, 40. The first channel 30 of the body 12, being approximately parallel to the second channel 40, may have the same length $L_1$ as the second channel 40. When the second end of the Rogowski coil 52 is inserted into the second end 32 of the first channel 30, a second loop of the Rogowski coil is formed between the respective second open ends 32, 42 of the first and second channels 30, 40. As will be understood from the disclosure herein, the size of the first loop and the second loop is selectively adjustable by sliding movement of the Rogowski coil 14 within the second channel 40. When an insulated conductor 80 is situated within the second loop formed by the Rogowski coil 14 (see FIG. 8), the non-contact sensor 20 is operative to sense at least one electrical parameter of the insulated conductor 80 without requiring galvanic contact with the insulated conductor 80.

Figure 6:
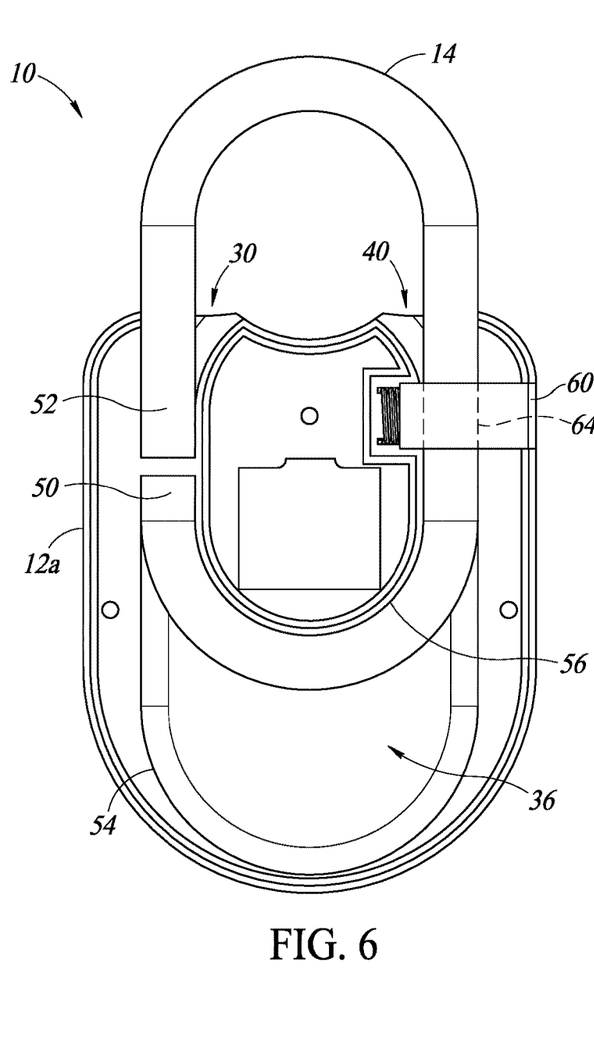
FIG. 6 is a rear elevation view of the sensor probe as shown in FIG. 5, in which the Rogowski coil is extended from the body of the sensor probe.
Figure 7:
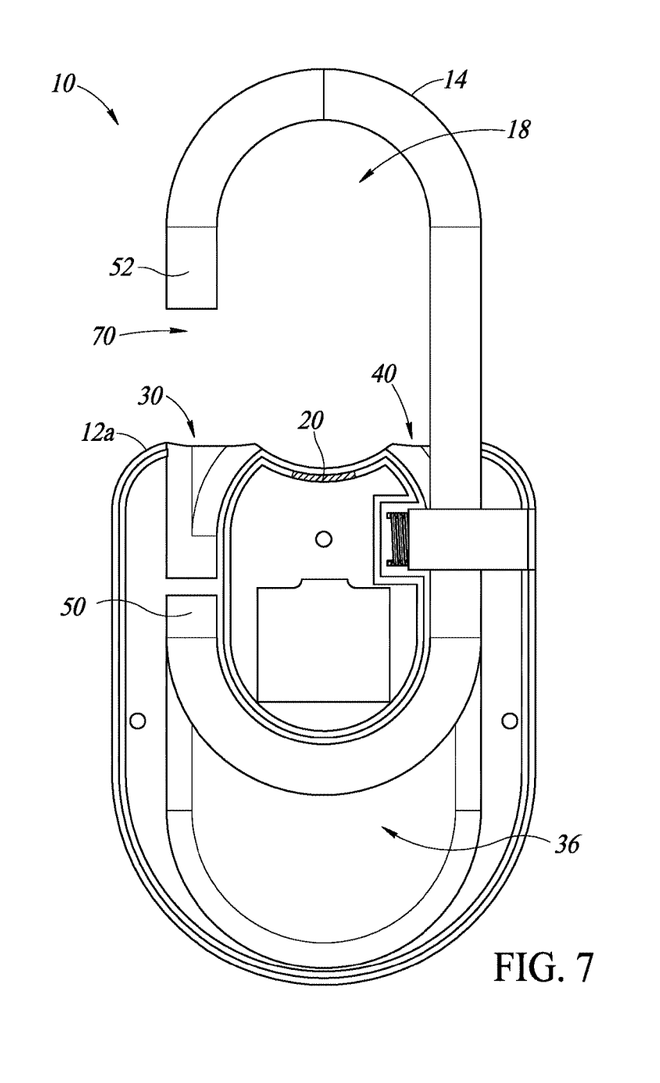
FIG. 7 is a rear elevation view of the sensor probe as shown in FIG. 6, in which a second end of the Rogowski coil is withdrawn from the body of the sensor probe, providing access to an interior region of the Rogowski coil.

FIG. 6 is a rear elevation view of the sensor probe 10 as shown in FIG. 5, in which the Rogowski coil 14 is extended from the body 12. In FIG. 7, the second end 52 of the Rogowski coil 14 is withdrawn from the first channel 30, providing a gap 70 that allows an insulated conductor 80 to access and pass into the interior region 18 of the Rogowski coil 14. FIG. 8 is a rear elevation view of the sensor probe 10 in which an insulated conductor 80 is positioned within the interior region 18 of the Rogowski coil 14. Additionally in FIG. 8, the Rogowski coil 14 has been partially retracted within the body 12 of the sensor probe 10, thus tightening the Rogowski coil 14 against the insulated conductor 80 and holding the insulated conductor 80 proximate to the non-contact sensor 20.

In some embodiments, the second end 32 of the first channel 30 of the body 12 may include a fastener that is operative to releasably secure the second end 52 of the Rogowski coil 14 within the first channel 30 when the second end 52 of the Rogowski coil 14 is selectively inserted into the first channel 30. Such a fastener may be a conventional fastener is used in typical Rogowski coil instruments having a detachable coil end. In other embodiments, when the second end 52 of the Rogowski coil 14 is selectively inserted into the second end 32 of the first channel 30, sidewalls of the first channel 30 may abut the Rogowski coil 14 and releasably secure the second end 52 of the Rogowski coil 14 within the first channel 30 by an interference fit. Generally, it is expected that the Rogowski coil is not removable from the second channel 40 during normal use of the sensor probe 10.

In some embodiments, the sensor probe 10 may further include a second non-contact sensor coupled to a portion of the Rogowski coil 14. In such embodiments, the second non-contact sensor may be operative to sense an electrical parameter in an insulated conductor 80 when the insulated conductor 80 is within interior region 18 of the second loop formed by the Rogowski coil 14.

In some embodiments, the sensor probe 10 may further include an interface connector operatively coupled via a cable and/or wires (e.g., extending through the protective shell 24) to the non-contact sensor 20 and the Rogowski coil 14, typically by way of circuitry 28 in the sensor probe 10. It is anticipated that such an interface connector is configured to be detachably couplable to a corresponding interface connector of a measuring device (not illustrated) configured to receive signals and data from the sensor probe 10.

In some embodiments, the sensor probe 10 may further include a locking mechanism 60 that is operative in an open position, e.g., as shown in FIGS. 5-7, to allow the Rogowski coil 14 to freely slide within the second channel 40. As illustrated in FIG. 6, the locking mechanism 60 has a channel 64 that is lined up with the second channel 40. The Rogowski coil 14 is thus able to freely slide within a channel 64 and the channel 40. In a closed position, e.g., as shown in FIG. 8, a user has released the locking mechanism 60 and the locking mechanism 60 has slightly shifted outward. When the locking mechanism 60 is released, a biasing element (e.g., a spring) 62 pushes an inner sidewall of the channel 64 against the portion of the Rogowski coil 14 in the channel 6. With the inner sidewall of the channel 64 now bearing against the Rogowski coil 14, friction helps lock the position of the Rogowski coil 14 in place. In this manner, the locking mechanism 60 releasably secures the Rogowski coil 14 and prevents sliding movement of the Rogowski coil 14 within the second channel 40, thus helping the Rogowski coil 14 to hold the insulated conductor 80 against the non-contact sensor 20.

The body 12 of the sensor probe 10 includes an interior cavity 36 that is sized to receive and preferably encompass the first loop of the Rogowski coil 14. The interior cavity 36 is defined by inner sidewalls 54, 56 within the body 12, and laterally by inner sidewalls of the front and rear 12a, 12b of the body 12. When an insulated conductor 80, as depicted in FIG. 8, is placed within the interior region 18 of the first loop, the Rogowski coil may be tightened down on the insulated conductor 80 by sliding the Rogowski coil 14 through the second channel 40 (thus reducing the size of the inner region 18). In this process, the balance of the Rogowski coil 14 that has slid through the second channel 40 is received within the cavity 36.

Figure 9:
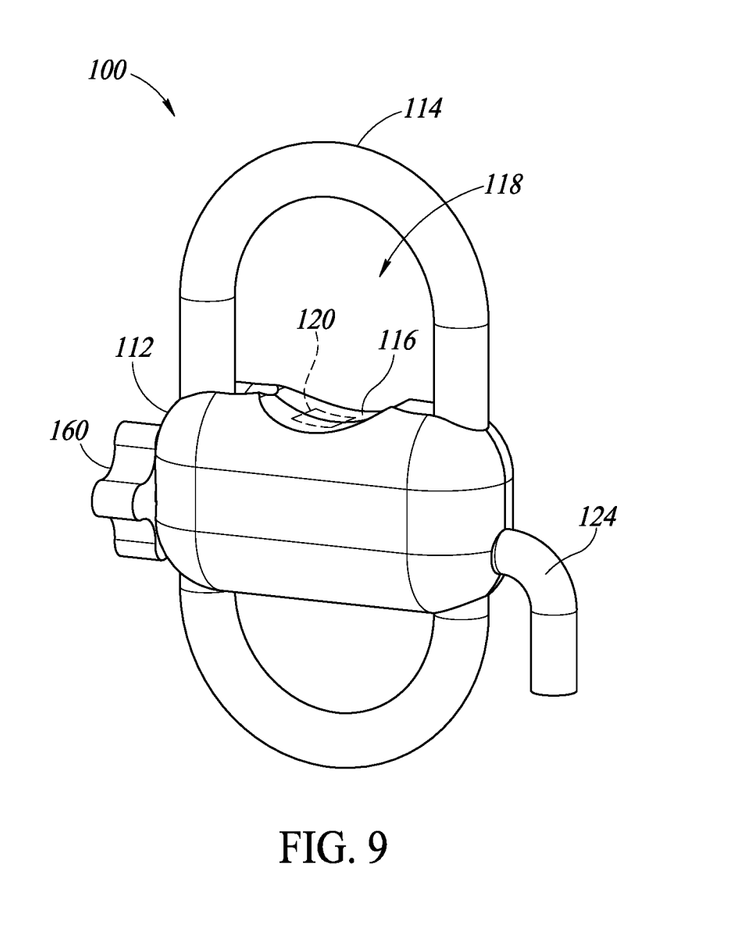
FIG. 9 is a front, right perspective view of another non-limiting embodiment of an electrical parameter sensor probe that includes a body, a Rogowski coil, and a non-contact sensor.
Figure 10:
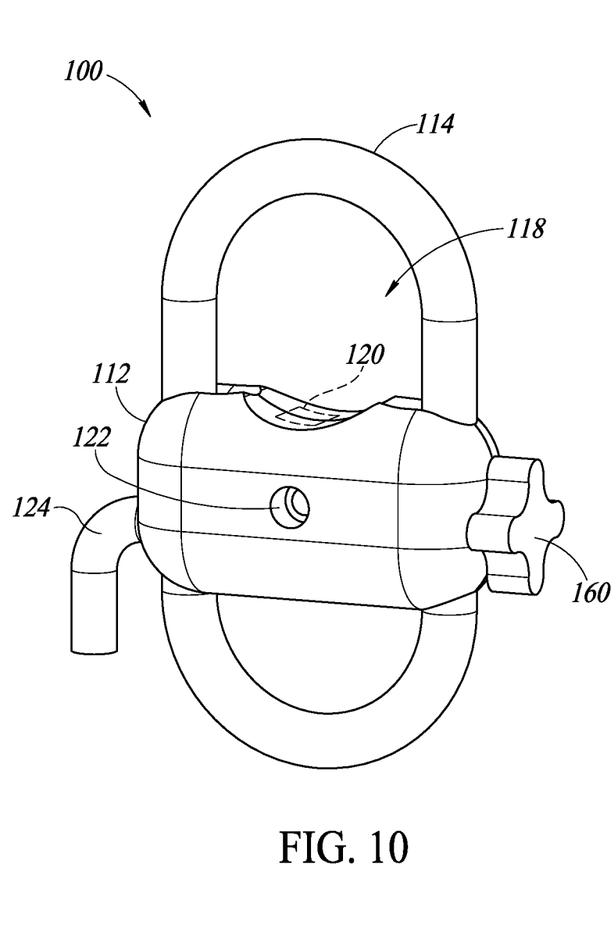
FIG. 10 is a rear, right perspective view of the sensor probe of FIG. 9.

FIG. 9 is a front, right perspective view of another non-limiting embodiment of an electrical parameter sensor probe 100 that includes a body 112, a Rogowski coil 114, and a non-contact sensor 120. FIG. 10 is a rear, right perspective view of the sensor probe 100 shown in FIG. 9. Similar to the sensor probe 10 shown in FIGS. 1-8, the Rogowski coil 114 of the sensor probe 100 shown in FIGS. 9-16 may be looped around an insulated conductor (e.g., conductor 180 shown in FIG. 16) and slid through a second channel in the sensor probe 100 to tighten down the Rogowski coil 114 against the conductor 180 and hold the conductor 180 proximate to the non-contact sensor 120.

Figure 11:
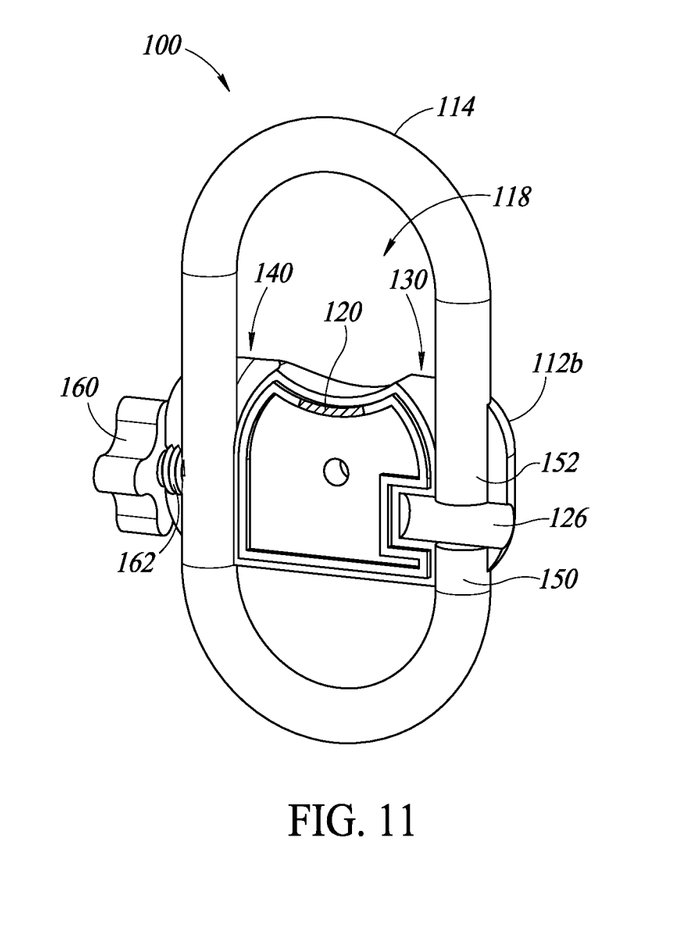
FIG. 11 is a front, right perspective view of the sensor probe of FIG. 9, in which a front half of the body of the sensor probe has been removed.
Figure 12:
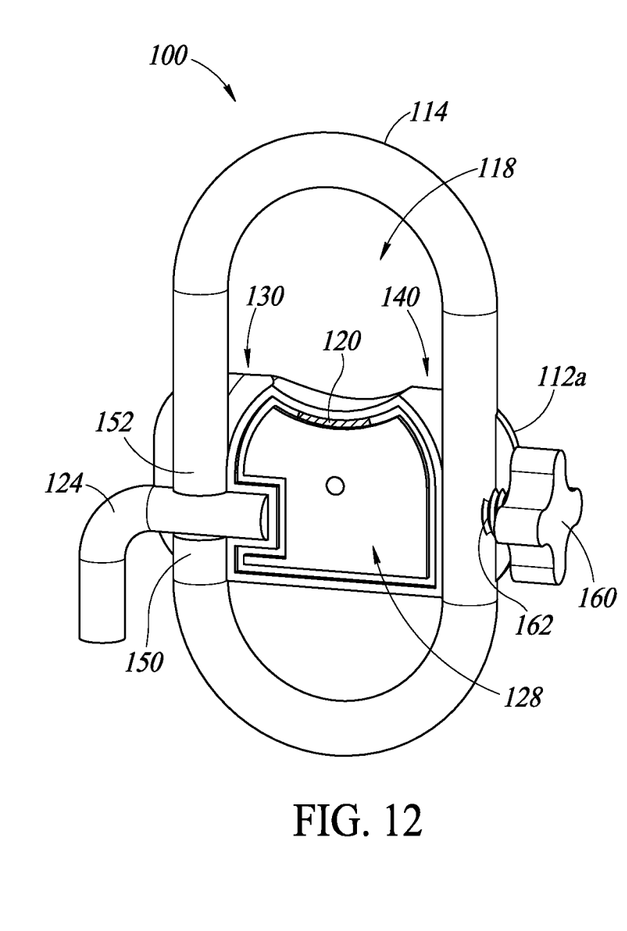
FIG. 12 is a rear, right perspective view of the sensor probe of FIG. 9, in which a rear half of the body of the sensor probe has been removed.
Figure 13:
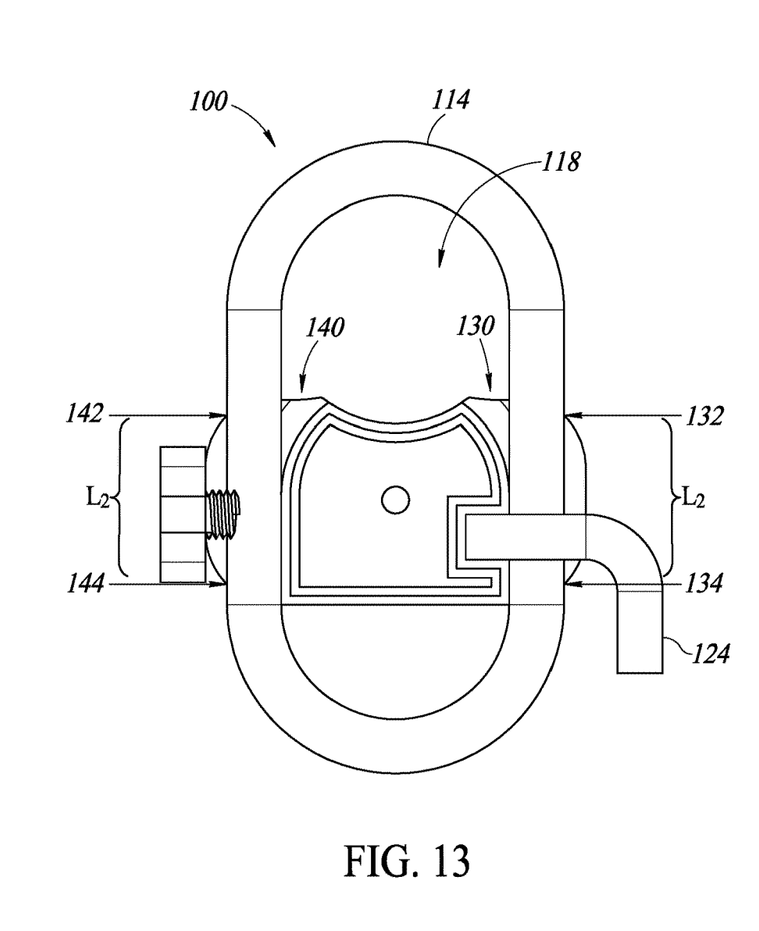
FIG. 13 is a front elevation view of the sensor probe of FIG. 9.

With regard to FIGS. 11-13, FIG. 11 is a front, right perspective view of the sensor probe 110 in which a front half 112a of the body 112 of the sensor probe has been removed, showing the interior of the rear half 112b of the body, while FIG. 12 is a rear, right perspective view in which the rear half 112b of the body 112 has been removed, showing the interior of the front half 112a of the body 112. FIG. 13 is a front elevation view of the sensor probe 110 shown in FIG. 9.

The sensor probe 100, as depicted, includes a locking mechanism 160 that can be screwed toward the portion of the Rogowski coil 114 in the second channel 140 in the body 112. When the screw 162 of the locking mechanism 160 bears against the Rogowski coil 140, the screw 162 secures the Rogowski coil 114 in place. When the locking mechanism 160 is unscrewed, the screw 162 releases from the Rogowski coil 114 and the Rogowski coil 114 is able to freely slide within the second channel 140.

In some embodiments, the body 112 is comprised of two halves 112a, 112b that may be fixedly or removably coupled to each other. In the embodiment shown in FIG. 10, a screw or other securing mechanism may be inserted through aperture 122 to secure the rear half 112b to the front half 112a of the body 112. Projecting out of the side of the body 112 is a protective shell 124 that receives a cable (not shown). The cable may be used to connect the sensor probe 10 to external equipment, such as a measuring instrument, that receives and processes measurement signals or data communicated by the sensor probe 100.

As with the Rogowski coil 14, the Rogowski coil 114 is flexible and has a length that extends between a first end 150 and a second end 152. The Rogowski coil 114 may be constructed the same as the Rogowski coil 14 described above.

Similar to the non-contact sensor 20, the non-contact sensor 120 (e.g., a non-contact voltage sensor) is coupled to the body 112 within a concave saddle 116 defined in a side of the body 112. The non-contact sensor 120 operates to sense an electrical parameter (e.g., voltage) in an insulated conductor under test without requiring a galvanic connection with the conductor. Additionally or alternatively, one or more non-contact sensors may be coupled to the Rogowski coil 114. The non-contact sensor 120 may be electrically connected to a cable such that signals from the sensor 120 are sent to a measuring instrument for processing. In various embodiments, as with the sensor 20 previously described, the non-contact sensor 120 may include a non-contact voltage sensor, a non-contact current sensor, a Hall Effect element, a current transformer, a fluxgate sensor, an anisotropic magnetoresistance (AMR) sensor, a giant magnetoresistance (GMR) sensor, or other types of sensors operative to sense an electrical parameter of the insulated conductor (e.g., conductor 80 shown in FIG. 8) without requiring galvanic contact.

The sensor probe 100 may also include processing or control circuitry 128 that is operatively coupled to the non-contact sensor 120 and/or the Rogowski coil 114. The processing or control circuitry 128 is operative to process sensor signals received from the sensor 120 and/or the Rogowski coil 114, and to send sensor data indicative of such sensor signals to control circuitry in an external measuring instrument. As with the control circuitry 28, the control circuitry 128 may additionally or alternatively include conditioning or conversion circuitry that is operative to condition or convert the sensor signals into a form receivable by a measuring instrument, such as an analog form or a digital form.

It may be advantageous for the sensor 120 to be as close as possible to the conductor 180 under test (see FIG. 16), and in some implementations, it may be advantageous for the conductor 180 to be positioned at a particular orientation (e.g., perpendicular) relative to the non-contact sensor 120. With the sensor probe 100, a loop of the Rogowski coil 114 is selectively adjustable such that, as shown in FIG. 16, the loop can be tightened around the conductor 180 to properly position the conductor so that an accurate measurement can be obtained.

FIGS. 11-16 depict components that are interior to the body 112 of the sensor probe 100. The body 112 of the sensor probe 100 includes a first channel 130 and a second channel 140. The first channel 130 and the second channel 140 each have respective first and second open ends 134, 132 and 144, 142 that are spaced apart from each other. The first and second channels 130, 140 extend through the body 112 approximately parallel to each other.

The Rogowski coil 114 has first and second ends 150, 152. The first end 150 of the Rogowski coil is fixed within the first channel 130. The Rogowski coil 114 extends out of the first end 134 of the first channel 130, passes through the first and second ends 144, 142 of the second channel 140, and loops back to the second end 132 of the first channel 130 where the second end 152 of the Rogowski coil 114 is selectively insertable into the first channel 130 opposite the first end 150 of the Rogowski coil 114. The non-contact sensor 120 is coupled to the body 112 and positioned between the respective second ends 132, 142 of the first and second channels 130, 140.

The second channel 140 of the body 112 is sized and dimensioned to contain a length $L_2$ of the Rogowski coil 114. A first loop of the Rogowski coil is formed between the respective first open ends 134, 144 of the first and second channels 130, 140. Where the first channel 130 is approximately parallel to the second channel 140, the first channel 130 may have the same length $L_2$ as the second channel 140. When the second end of the Rogowski coil 152 is inserted into the second end 132 of the first channel 130, a second loop of the Rogowski coil is formed between the respective second open ends 132, 142 of the first and second channels 130, 140. The size of the first loop and the second loop is selectively adjustable by sliding movement of the Rogowski coil 114 within the second channel 140. When an insulated conductor 80 is situated within the second loop formed by the Rogowski coil 114 (see FIG. 16), the non-contact sensor 120 is operative to sense at least one electrical parameter of the insulated conductor 180 without requiring galvanic contact with the insulated conductor 180.

Figure 14:
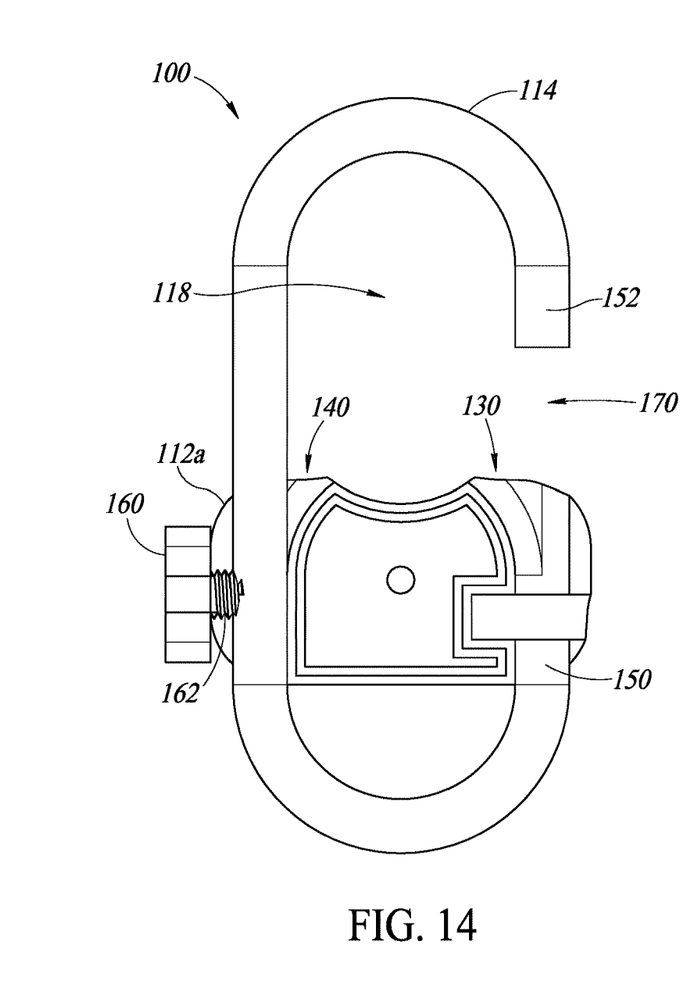
FIG. 14 is a front elevation view of the sensor probe as shown in FIG. 13, in which a second end of the Rogowski coil is withdrawn from the body of the sensor probe, providing access to an interior region of the Rogowski coil.
Figure 15:
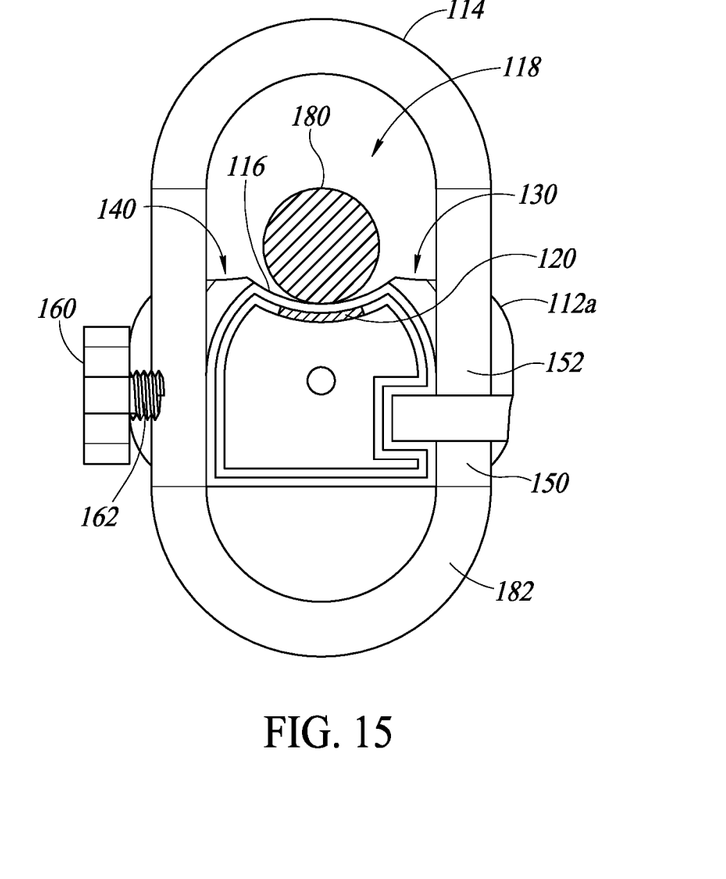
FIG. 15 is a front elevation view of the sensor probe as shown in FIG. 13, in which an insulated conductor is positioned within the interior region of the Rogowski coil.

FIGS. 14-16 illustrate front elevation views of the sensor probe 110 in operation to receive an insulated conductor 180 into an interior region 118 of the Rogowski coil 114. The Rogowski coil 114 may then be tightened down against the conductor 180 to hold the conductor 180 proximate to the non-contact sensor 120, similar to the operation of the sensor probe 10 shown in FIGS. 7 and 8.

In FIG. 14, the second end 152 of the Rogowski coil 114 is withdrawn from the body 112 of the sensor probe 100, providing a gap 170 that allows an insulated conductor to access the interior region 118 of the Rogowski coil 114. FIG. 15 depicts a front elevation view of the sensor probe 100 as shown in FIG. 13, in which an insulated conductor 180 is situated within the interior region 118 of the Rogowski coil 114.

In FIGS. 15 and 16, the second end 152 of the Rogowski coil 114 has been reinserted into the first channel 130, thus closing an upper loop of the Rogowski coil 114 around the insulated conductor 180. A user of the sensor probe 100 may then grasp and pull on a lower portion 182 of the Rogowski coil 114. Where the first end of the Rogowski coil 114 is fixed within first channel 130, pulling on the lower portion 182 effectively pulls a length of the Rogowski coil 114 through the second channel 140. The length of the Rogowski coil 114 second channel 140 until the upper loop of the Rogowski coil 114 bears against the insulated conductor 180 as shown in FIG. 16. In FIG. 16, the Rogowski coil 114 has been retracted to hold the insulated conductor 180 in place. The locking mechanism 160 may be screwed down to inward to help secure the retracted Rogowski coil 114.

With the second end 152 of the Rogowski coil 114 positioned near the first end 150, the gap between the ends of the Rogowski coil proximate to the channel 126 is minimized, which improves the accuracy of the current measurement provided by the Rogowski coil by better suppression of the influence of nearby external wires.

As can be seen, there are advantages to providing a sensor probe 10, 100 with first and second channels 30, 40 and 130, 140 that are approximately parallel to one another. As the Rogowski coil 14, 114 slides through the second channel 40, 140, there are no curves in the channel that otherwise, by friction, may diminish the free passage of the Rogowski coil 14, 114 through the second channel 40, 140. Locking mechanisms 60, 160 are more readily implemented to help hold the Rogowski coil 14, 114 in place once the Rogowski coil has been cinched down onto the insulated conductor 80, 180 under test.

With the sensor probe 10, the body 12 includes a cavity 36 that receives the portion of the Rogowski coil that has passed through the second channel 40. By maintaining this portion of the Rogowski coil 14 within the body 12, extraneous wires may be prevented from inadvertently passing through the lower loop of the Rogowski coil (opposite to the loop that surrounds the insulated conductor 80), which would disrupt an accurate measurement of the conductor 80.

With the sensor probe 100, the lower loop 182 of the Rogowski coil 114 provides an arrangement that is easier for a user of the sensor probe 102 grasp the Rogowski coil 114 and pull the coil downward so as to sense the Rogowski coil onto the insulated conductor 180.

Although not explicitly depicted in the drawings, the sensor probe 10, 100 may be communicatively coupled to a measuring instrument as mentioned above. The measuring instrument may be of any suitable form and/or function. In at least some implementations, the measuring instrument may include a main body or housing. An interface connector of the sensor probe 10, 100 detachably couples with a corresponding interface connector of the measuring instrument. In at least some implementations, the interface connector of the sensor probe may be configured as one of a plug and a socket, and the interface connector of the measuring instrument may be configured as the other of a plug and socket. Further, in some implementations, the sensor probe may be fixedly connected to the measuring instrument by a cable, or the sensor probe and the measuring instrument may be formed together in a single housing, such that a cable to connect them is not required.

The main body of the measuring instrument may include a display that presents measurement results and other information, and a user interface for inputting information such as measurement instructions or other information. The display may be a display of any suitable type, such as a liquid crystal display (LCD), a light-emitting diode (LED) display, an organic LED display, a plasma display, or an e-ink display. The main body 102 may include one or more audio or haptic outputs (not shown), such as one or more speakers, buzzers, vibration devices, etc. The user interface may include any of a plurality of buttons, a touch pad, touch screen, wheel, knob, dial, and/or microphone, etc.

The main body of the measuring instrument may further include a power supply, such as a battery or battery pack, for supplying power to the various components of the measuring instrument and possibly also the sensor probe 10, 100. Generally, the measuring instrument also includes control circuitry that controls the various operations of the combination device (sensor probe and measuring instrument), such as receiving signals from the sensor probe, determining one or more electrical parameters of an insulated conductor under measurement, and outputting measurement data (e.g., to the display). The control circuitry may include one or more processors (e.g., microcontroller, DSP, ASIC, FPGA), one or more types of memory (e.g., ROM, RAM, flash memory, other nontransitory storage media), and/or one or more other types of processing or control related components.

In at least some implementations, the measuring instrument may include a wireless communications subsystem such as a Bluetooth® module, a Wi-Fi® module, a ZIGBEE® module, a near field communication (NFC) module, etc. The measuring instrument may be operative to communicate wirelessly via the wireless communications subsystem with an external system, such as a computer, smart phone, tablet, personal digital assistant, etc., so as to transmit measurement results to the external system or to receive instruction signals or input information from the external system. The measuring instrument may additionally or alternatively include a wired communications subsystem, such as a USB interface, etc.

It should be understood that the various embodiments described above can be combined to provide yet further embodiments. To the extent that they are not inconsistent with the teachings and definitions herein, the disclosure in U.S. Provisional Patent Application No. 62/421,124, filed Nov. 11, 2016; U.S. Pat. No. 10,119,998, issued Nov. 6, 2018; U.S. Pat. No. 10,139,435, issued Nov. 27, 2018; U.S. Pat. No. 10,281,503, issued May 7, 2019; U.S. Pat. No. 10,591,515, issued Mar. 17, 2020; U.S. Pat. No. 10,352,967, issued Jul. 16, 2019; and U.S. Pat. No. 10,746,767, issued Aug. 18, 2020, are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific implementations disclosed in the specification and the claims, but should be construed to include all possible embodiments along with the full scope of equivalents to which such claims are entitled. Accordingly, the claims are not limited by the disclosure.

The invention claimed is:

1. A sensor probe, comprising:
   a body including:
      a first channel having a first length;
      a second channel having a second length, wherein the second length of the second channel is spaced apart from and approximately parallel to the first length of the first channel; and
      a non-contact sensor that is operative to sense at least one electrical parameter in a conductor without requiring galvanic contact with the conductor; and
   a Rogowski coil that is slidably positioned in the first and second channels of the body and forms a loop, wherein a size of the loop is adjustable by sliding a portion of the Rogowski coil relative to the body in at least one of the first channel or the second channel; and
   wherein the non-contact sensor and the Rogowski coil are operative to sense an electrical parameter in the conductor when the conductor is within the loop of the Rogowski coil and positioned proximate to the non-contact sensor.

2. The sensor probe of claim 1, wherein the size of the loop is reduced by sliding the Rogowski coil in at least one of the first channel or the second channel, to retain the conductor proximate to the non-contact sensor.

3. The sensor probe of claim 1, wherein the Rogowski coil has a first end and a second end, and the first end of the Rogowski coil is fixed within the first channel of the body.

4. The sensor probe of claim 3, wherein the second end of the Rogowski coil is removably insertable into the first channel to abut the first end of the Rogowski coil that is fixed within the first channel, and when the second end is removed from the first channel, a gap is formed which allows the conductor to pass and be positioned within the loop.

5. The sensor probe of claim 4, wherein the first channel of the body includes a fastener that is operative to releasably secure the second end of the Rogowski coil within the first channel when the second end of the Rogowski coil is inserted into the first channel.

6. The sensor probe of claim 4, wherein sidewalls of the first channel releasably secure the second end of the Rogowski coil within the first channel by an interference fit when the second end of the Rogowski coil is inserted into the first channel.

7. The sensor probe of claim 4, further comprising a locking mechanism that is operative in an open position to allow the Rogowski coil to slide within the first and/or second channel, and in a closed position to releasably secure the Rogowski coil to prevent sliding movement of the Rogowski coil.

8. The sensor probe of claim 1, further comprising a second non-contact sensor coupled to the Rogowski coil, wherein the second non-contact sensor is operative to sense an electrical parameter in the conductor when the conductor is within the loop of the Rogowski coil.

9. The sensor probe of claim 1, wherein the body is shaped with a concave saddle opposite to the loop of the Rogowski coil, and the non-contact sensor is coupled to the body within the concave saddle.

10. The sensor probe of claim 1, further comprising an interface connector electrically coupled to the non-contact sensor and the Rogowski coil to convey a sensed electrical parameter to a measuring device.

11. The sensor probe of claim 1, wherein the non-contact sensor comprises at least one of a non-contact voltage sensor, a non-contact current sensor, a Hall Effect sensor, a fluxgate sensor, an anisotropic magnetoresistance (AMR) sensor, or a giant magnetoresistance (GMR) sensor.

12. The sensor probe of claim 1, wherein the body further includes an interior cavity that encompasses a portion of the Rogowski coil outside of the first and second channels.

13. The sensor probe of claim 1, further comprising control circuitry in communication with the non-contact sensor and the Rogowski coil, wherein the control circuitry is configured to receive a signal from at least one of the non-contact sensor or the Rogowski coil and process the signal to sense the at least one electrical parameter in the conductor.

14. A sensor probe, comprising:
a body including a first channel, a second channel, and a non-contact sensor that is operative to sense at least one electrical parameter in a conductor without requiring galvanic contact with the conductor; and
a Rogowski coil having a first end and a second end, wherein the first end is fixed within the first channel and the second end of the Rogowski coil is removably insertable into the first channel, wherein the Rogowski coil is slidable within the first channel and/or the second channel of the body,
wherein the Rogowski coil forms a loop of adjustable size relative to the body when the second end of the Rogowski coil is inserted into the first channel, and
wherein the non-contact sensor and the Rogowski coil are operative to sense an electrical parameter in the conductor when the conductor is within the loop of the Rogowski coil and positioned proximate to the non-contact sensor.

15. The sensor probe of claim 14, wherein when the second end of the Rogowski coil is inserted into the first channel, the second end of the Rogowski channel abuts the first end of the Rogowski coil within the first channel, and wherein a size of the loop is adjustable by sliding movement of the Rogowski coil in at least the second channel of the body.

16. The sensor probe of claim 14, wherein a gap formed by removal of the second end of the Rogowski coil from the first channel allows the conductor to pass into the loop and be positioned proximate to the non-contact sensor.

17. The sensor probe of claim 14, wherein sliding movement of the Rogowski coil reduces a size of the loop to retain the conductor is a position proximate to the non-contact sensor.

18. The sensor probe of claim 14, further comprising a fastener in the first channel of the body that releasably secures the second end of the Rogowski coil within the first channel when the second end of the Rogowski coil is inserted into the first channel.

19. The sensor probe of claim 14, wherein the second end of the Rogowski coil is releasably secured within the first channel by an interference fit when the second end of the Rogowski coil is inserted into the first channel.

20. The sensor probe of claim 14, further comprising a locking mechanism configured to selectively allow the Rogowski coil to slide within the first channel and/or the second channel and secure the Rogowski coil to prevent sliding movement of the Rogowski coil.

* * * * *